US009793006B2

(12) United States Patent
Zheng et al.

(10) Patent No.: US 9,793,006 B2
(45) Date of Patent: Oct. 17, 2017

(54) GATE DRIVING CIRCUIT AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Liangliang Zheng, Beijing (CN); Jian He, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 149 days.

(21) Appl. No.: 14/422,917

(22) PCT Filed: Jul. 30, 2014

(86) PCT No.: PCT/CN2014/083355
§ 371 (c)(1),
(2) Date: Feb. 20, 2015

(87) PCT Pub. No.: WO2015/078196
PCT Pub. Date: Jun. 4, 2015

(65) Prior Publication Data
US 2016/0049208 A1 Feb. 18, 2016

(30) Foreign Application Priority Data
Nov. 27, 2013 (CN) .......................... 2013 1 0617047

(51) Int. Cl.
*G11C 19/28* (2006.01)
*G09G 3/20* (2006.01)
*G09G 3/36* (2006.01)

(52) U.S. Cl.
CPC ............. *G11C 19/287* (2013.01); *G09G 3/20* (2013.01); *G09G 3/3674* (2013.01);
(Continued)

(58) Field of Classification Search
CPC ...... G09G 3/20; G09G 3/3677; G09G 3/3674; G09G 2310/0267; G09G 2310/0286;
(Continued)

(56) References Cited
U.S. PATENT DOCUMENTS 6,323,849 B1    11/2001  He et al.
7,903,076 B2 *  3/2011   Hsu ....................... G06F 1/3203
                                                    345/100
(Continued)

FOREIGN PATENT DOCUMENTS

CN    1180418 A    4/1998
CN    1262454 A    8/2000
(Continued)

OTHER PUBLICATIONS

English Version of the International Search Report and Written Opinion dated Oct. 27, 2014; PCT/CN2014/083355.
(Continued)

*Primary Examiner* — Nalini Mummalaneni
(74) *Attorney, Agent, or Firm* — Ladas & Parry LLP

(57) ABSTRACT

The present disclosure provides a gate driving circuit and a display apparatus, wherein the gate driving circuit comprises a shift register (10) including a plurality of shift register units connected with each other sequentially, and the gate driving circuit further comprises: a first strobe module (20) and/or a second strobe module (30); the first strobe module (20), connected to a gate scanning trigger signal line (STV) and strobe signal lines (CS0, CS1); the second strobe module (30), connected to the strobe signal lines. With incorporation of the first strobe module (20), a gate scanning
(Continued)

trigger signal on a gate scanning trigger signal line (STV) is supplied to a predetermined shift register unit according to strobe signals provided on the strobe signal lines (CS0, CS1); and the second strobe module (30), which is configured to cut off communication between the predetermined shift register unit and its previous stage of shift register unit according to the strobe signals provided on the strobe signal lines (CS0, CS1), so that the shift register is turned off from the predetermined shift register unit, and thus it can be achieved on a liquid crystal display panel that the gate signal(s) in a black-scan area are selectively turned off in a partial display mode, thus power consumption of the whole display panel being reduced.

16 Claims, 4 Drawing Sheets

(52) U.S. Cl.
CPC ... *G09G 3/3677* (2013.01); *G09G 2300/0426* (2013.01); *G09G 2310/0267* (2013.01); *G09G 2310/0286* (2013.01); *G09G 2310/04* (2013.01); *G09G 2310/08* (2013.01); *G09G 2330/021* (2013.01)

(58) Field of Classification Search
CPC ........... G09G 2310/04; G09G 2310/08; G09G 2330/021; G09G 2300/0426; G11C 19/287
See application file for complete search history.

(56) References Cited

U.S. PATENT DOCUMENTS

| | | |
|---|---|---|
| 2002/0005843 A1 | 1/2002 | Kurumisawa et al. |
| 2003/0197472 A1* | 10/2003 | Kanauchi ............. G09G 3/3266 315/169.1 |
| 2004/0047530 A1 | 3/2004 | Hara et al. |
| 2007/0040792 A1 | 2/2007 | Kwag et al. |
| 2010/0156858 A1 | 6/2010 | Moon et al. |
| 2011/0025679 A1* | 2/2011 | Park .................... G09G 3/3266 345/213 |

FOREIGN PATENT DOCUMENTS

| | | |
|---|---|---|
| CN | 1453761 A | 11/2003 |
| CN | 1467696 A | 1/2004 |
| CN | 1783173 A | 6/2006 |
| CN | 1885379 A | 12/2006 |
| CN | 103680439 A | 3/2014 |
| CN | 103680442 A | 3/2014 |
| CN | 103680443 A | 3/2014 |

OTHER PUBLICATIONS

First Chinese office Action Appln. No. 201310617047.8; Dated Jun. 10, 2015.
International Search Report dated Nov. 10, 2014; PCT/CN2014/083355.
Written Opinion of the International Searching Authority dated Oct. 20, 2014; PCT/CN2014/083355.

* cited by examiner

| strobe signal | | first pulse signal strobe 20 | | | | second pulse signal strobe 30 | | |
|---|---|---|---|---|---|---|---|---|
| CS0 | CS1 | 211 | 212 | 213 | 214 | 301 | 302 | 303 |
| 0 | 0 | STV | VGL | VGL | VGL | S | S | S |
| 0 | 1 | VGL | STV | VGL | VGL | S | S | 0 |
| 1 | 0 | VGL | VGL | STV | VGL | S | 0 | 0 |
| 1 | 1 | VGL | VGL | VGL | STV | 0 | 0 | 0 |

GATE DRIVING CIRCUIT AND DISPLAY APPARATUS

TECHNICAL FIELD

The present disclosure relates to a field of liquid crystal display technique, and particularly to a gate driving circuit and a display apparatus.

BACKGROUND

Recently, with a vigorous development in a semiconductor technology, portable electronics and panel display products rise up accordingly. A Thin Film Transistor (TFT) liquid crystal display has become a standard output device for the various electronics gradually, because it has advantages such as a low operation voltage, no scattering from radiant rays, a light weight, a small volume, etc. As system integrities of various display devices, such as mobile phones, tablet PCs (PAD), are higher and higher and their thicknesses are thinner and thinner, a Central Processing Unit (CPU) of the system has been upgraded to a dual-core product system, a quad-core product system, an octa-core product system or even a product system with more cores from a previous single-core product system. However, a power consumption of the system is higher and higher, and requirements for an endurance time of the mobile phone and the PAD are also higher and higher, such that a continuing decreasing of the power consumption of the display device is a target pursued continually by system manufacturers and panel manufacturers.

The TFT liquid crystal display generally comprises a pixel matrix arranged in the horizontal direction and vertical direction, and when the TFT liquid crystal display displays an picture, gate input signals, namely signals G1, G2, . . . , Gn outputted from a driving circuit, are generated by the shift registers (SRs), and then the pixels in respective rows are scanned from the first row to the last row sequentially, as illustrated in FIG. 1. A gate driving clock signal CPV is input to an input terminal of each shift register, and a gate scanning trigger signal STV is input to the input terminal of the first stage of shift register unit SR1. In the design for the existing TFT liquid crystal device, the TFT liquid crystal display would perform a black-scan action when it is in a partial display state, that is to say, the gates of the TFT liquid crystal display would scan row by row from top to bottom, while source driving signals (that is, on data lines) remain at a low level all the time so as not to charge the TFT liquid crystal display, so that the power consumption of a source driving chip is reduced; the corresponding logic timing of the gates is as illustrated in FIG. 2.

The existing circuit design only reduces the power consumption of the source driving circuit, however, when the TFT liquid crystal display is in the partial display state, for example, when a movie with an aspect ratio of 16:9 is played back in a full screen mode on a screen with the aspect ratio of 4:3, black margins (that is, a black-scan area) exist at the top and bottom of the screen, while the gate driving circuit still scans row by row from top to bottom without shutting off the gate signals for the black-scan area, such that the power consumption of the gate driving circuit is not reduced and a whole power consumption of the liquid crystal display is still great.

SUMMARY

In view of this, the technical problem to be solved is how to reduce a power consumption of a gate driving circuit and in turn reduce a whole power consumption of a liquid crystal display panel.

According to one aspect, the present disclosure provides a gate driving circuit comprising a shift register comprising a plurality of shift register units connected with each other sequentially, it further comprising: a first strobe module and/or a second strobe module;

the first strobe module, connected to a gate scanning trigger signal line and strobe signal lines, is configured to provide a gate scanning trigger signal on the gate scanning trigger signal line to a predetermined shift register unit according to strobe signals provided by the strobe signal lines, in order that the shift register operates from the predetermined shift register unit; and/or the second strobe module, connected to the strobe signal lines, is configured to cut off communication between a predetermined shift register unit and its previous stage of shift register unit according to the strobe signals provided by the strobe signal lines, in order that the shift register is turned off from the predetermined shift register unit.

In an example, the first strobe module comprises a first pulse signal strobe and at least one OR gate, input terminals of the first pulse signal strobe is connected with the gate scanning trigger signal and the strobe signals respectively, a first output terminal thereof is connected with an input terminal of a first stage of shift register unit in the shift register, and other output terminals are connected with input terminals of the OR gates;

a first input terminal of the OR gate is connected with the output terminal, except for the first output terminal, of the first pulse signal strobe, a second input terminal of the OR gate is connected with an output terminal of a stage of shift register unit previous to the predetermined shift register unit, and an output terminal of the OR gate is connected with an input terminal of the predetermined shift register unit.

In an example, the second strobe module comprises:

a second pulse signal strobe, input terminals thereof are connected with the strobe signals and the output terminals of a stage of shift register unit previous to a predetermined shift register unit, respectively, and an output terminal thereof is connected with the input terminal of the predetermined shift register unit.

In an example, only one of the output terminals of the first pulse signal strobe is activated at the same moment.

In an example, the number of the strobe signals is N, the number of the output terminals of the first pulse signal strobe is M, the number of the OR gates is at most M−1, and the number of the output terminals of the second pulse signal strobe is L, wherein M≤$2^N$, L≤$2^N$, and L, M and N are all natural numbers.

In an example, the strobe signal comprises a first strobe signal and a second strobe signal, when N=2, M=4, L=3.

Optionally, except for the first stage of shift register unit, the output terminal of each stage of shift register units in the shift register is connected with a reset signal input terminal of a previous stage of shift register unit, and is configured to reset the previous stage of shift register unit; and the input terminal of each stage of shift register unit in the shift register is connected with a gate driving clock signal.

In an example, when both of the first strobe signal and the second strobe signal are at a low level, the first output terminal of the first pulse signal strobe is activated, the second output terminal, the third output terminal and the fourth output terminal output a low level, and the first output terminal, the second output terminal and the third output terminal of the second pulse signal strobe are activated.

In an example, when the first strobe signal is at a low level while the second strobe signal is at a high level, the second output terminal of the first pulse signal strobe is activated, the first output terminal, the third output terminal and the fourth output terminal output a low level, and the first output terminal and the second output terminal of the second pulse signal strobe are both activated but its third output terminal is not activated.

In an example, when the first strobe signal is at the high level and the second strobe signal is at the low level, the third output terminal of the first pulse signal strobe is activated, the first output terminal, the second output terminal and the fourth output terminal output the low level, and the first output terminal of the second pulse signal strobe is activated, neither of the second output terminal and the third output terminal is activated.

In an example, when both of the first strobe signal and the second strobe signal are at the high level, the fourth output terminal of the first pulse signal strobe is activated, the first output terminal, the second output terminal and the third output terminal output the low level, and none of the first output terminal, the second output terminal and the third output terminal of the second pulse signal strobe is activated.

According to another aspect, the present disclosure further provides a display apparatus comprising a plurality of gate lines and the gate driving circuit described above, and the output terminals of the respective shift register units are connected with the respective gate lines in a manner of one-to-one correspondence.

The present disclosure provides the gate driving circuit comprising a shift register including a plurality of shift register units connected with each other sequentially, wherein the gate driving circuit further comprises: a first strobe module and/or a second strobe module; the first strobe module, connected to a gate scanning trigger signal line and strobe signal lines, is configured to provide a gate scanning trigger signal on the gate scanning trigger signal line to a predetermined shift register unit according to strobe signals provided by the strobe signal lines, in order that the shift register operates from the predetermined shift register unit; the second strobe module, connected to the strobe signal lines, is configured to cut off communication between the predetermined shift register unit and a stage of shift register unit previous to the predetermined shift register unit according to the strobe signals provided by the strobe signal lines, in order that the shift register is turned off from the predetermined shift register unit. With incorporation of the first strobe module in the gate driving circuit, the gate scanning trigger signal can be controlled to be applied to the input terminal of the predetermined shift register unit so that the shift register operates from the predetermined shift register unit; with incorporation of the second strobe module, the shift register can turn off the gate output signals as scanned row by row from the predetermined shift register unit according to a status of the strobe signals, so that the it can be realized on a liquid crystal display panel that the gate signal(s) in a black-scan area are selectively turned off in a partial display mode, instead of performing the scan row by row from top to bottom without turning off the gate signals in the black-scan area, and thus the power consumption of the gate driving circuit is reduced and in turn the power consumption of the whole display panel is reduced.

DETAILED DESCRIPTION

Thereafter, embodiments of the present disclosure will be described clearly and completely in connection with drawings of the embodiments of the present disclosure. The following embodiments are only used to illustrate the present disclosure, instead of limiting a scope of the present invention.

Figure 1:
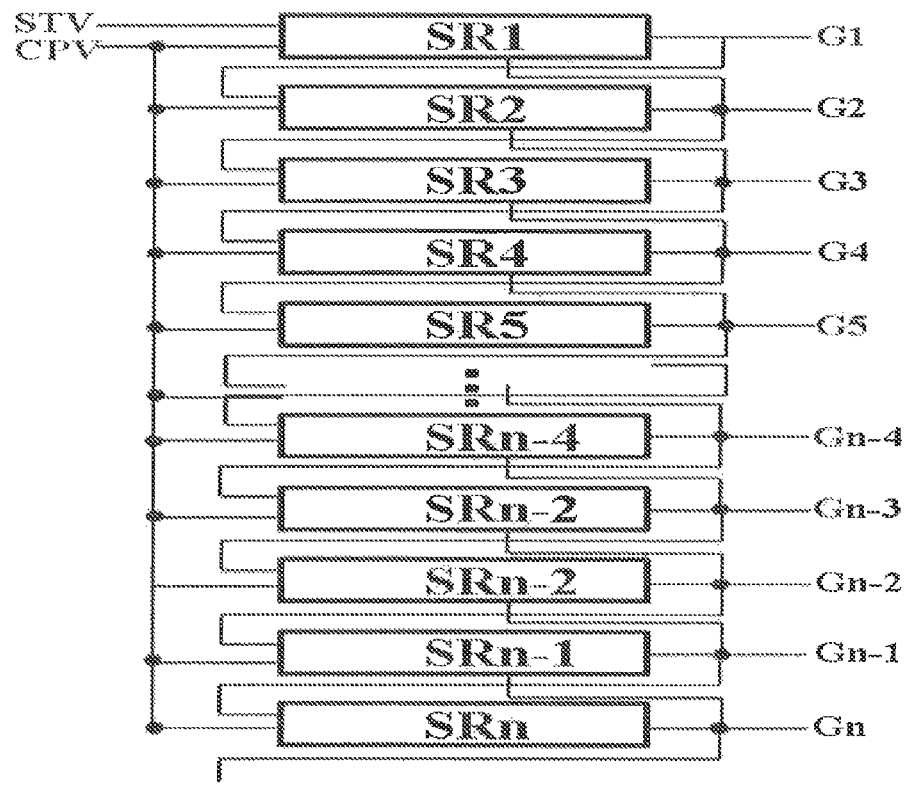
FIG. 1 is a view illustrating a design principle of a known gate driving circuit.
Figure 2:
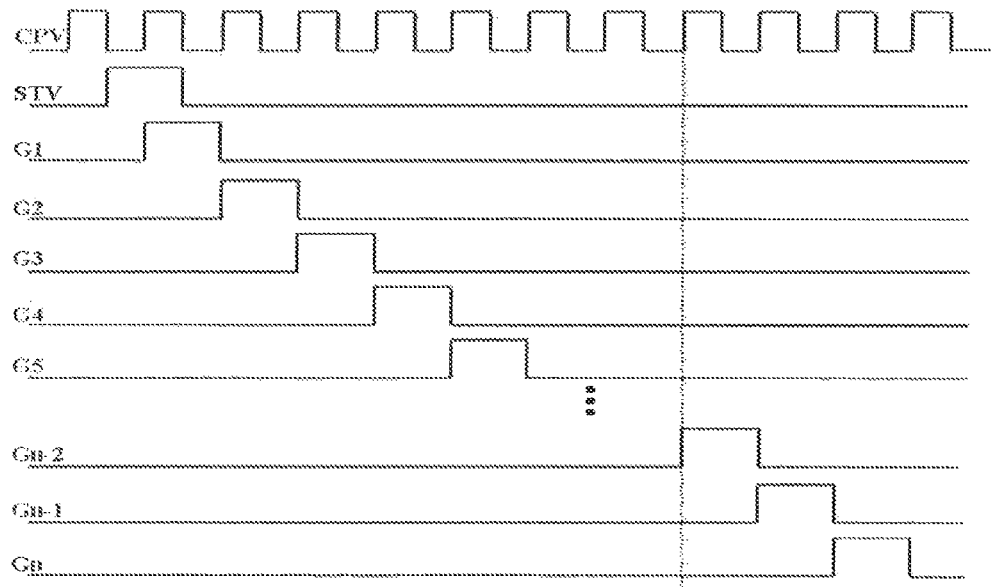
FIG. 2 is a logic timing diagram of the known gate driving circuit.
Figure 3:
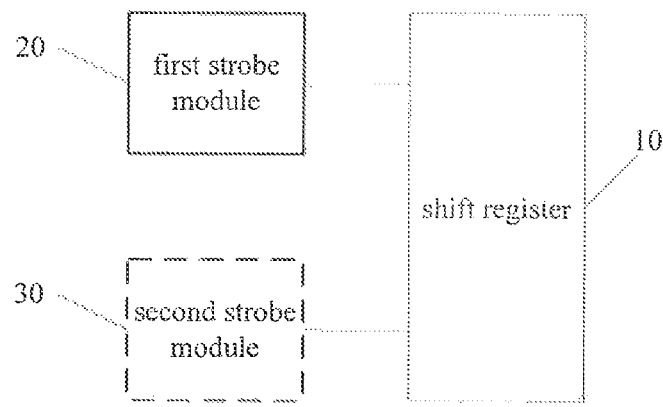
FIG. 3 is an exemplary view illustrating a configuration of a gate driving circuit according to an embodiment of the present disclosure.

The present disclosure provides a gate driving circuit, whose configuration exemplary view is illustrated in FIG. 3, comprising a shift register 10 including a plurality of shift register units connected with each other sequentially, it further comprises: a first strobe module 20 and/or a second strobe module 30;

wherein the first strobe module 20, connected to a gate scanning trigger signal line and strobe signal lines, is configured to provide a gate scanning trigger signal on the gate scanning trigger signal line to a predetermined shift register unit according to strobe signals provided by the strobe signal lines, in order that the shift register 10 starts to operate from the predetermined shift register unit; and/or the second strobe module 30, connected to the strobe signal lines, is configured to cut off communication between the predetermined shift register unit and its previous stage of shift register unit according to the strobe signals provided by the strobe signal lines, in order that the shift register 10 is shut off from the predetermined shift register unit.

In the above gate driving circuit, on a basis of the original gate driving circuit comprising the shift register, the first strobe module and the second strobe module are added, the first strobe module can control the gate scanning trigger signal to be applied to the input terminal of the predetermined shift register unit and the second strobe module can control the gate outputs scanned row by row to start to be shut off from the predetermined shift register unit so that the a liquid crystal display panel can shut off the gate signal(s) in a black-scan area selectively in a partial display mode, thus the power consumption of the gate driving circuit is reduced and in turn the power consumption of the whole display panel is reduced.

In an example, the shift register 10 according to the present embodiment comprises a plurality of stages of shift register units connected with each other sequentially, that is, the shift register 10 comprises n shift register units, denoted as 1, . . . , n in an order of their stages respectively, namely the first stage of shift register unit SR1, the second stage of shift register unit SR2, . . . , the (a−1)$^{th}$ stage of shift register unit SRa−1, the a$^{th}$ stage of shift register unit SRa, the (a+1)$^{th}$ stage of shift register unit SRa+1, . . . , and the n$^{th}$ stage of shift register unit SRn, and their respective output terminals are G1, G2, . . . , Ga−1, Ga, Ga+1, . . . , Gn.

It should be noted that the number of the strobe signals provided by the strobe signal lines is at least one, and no further limitations are made to the number of the strobe signals, which can be selected depending on a state of a partial display which can be compatible with.

In an example, except for the first stage of shift register unit SR1, the output terminal of each stage of shift register units in the shift register 10 is connected with a corresponding reset signal input terminal of a previous stage of shift register unit thereof, and is configured to reset the previous stage of shift register unit; and an input terminal of each stage of shift register unit in the shift register 10 is connected with a gate driving clock signal CPV. For example, the output terminal Ga of the $a^{th}$ stage of shift register unit SRa is connected with the reset signal input terminal of its previous stage of shift register unit (namely the $(a-1)^{th}$ stage of shift register unit SRa−1), and so on.

In an example, the first strobe module 20 according to the present embodiment comprises a first pulse signal strobe 21 and at least one OR gate, Input terminals of the first pulse signal strobe 21 are connected with the gate scanning trigger signal and the strobe signal respectively, a first output terminal thereof is connected with the input terminal of the first stage of shift register unit in the shift register, and other output terminal(s) is(are) connected with input terminal(s) of the OR gate(s) respectively;

a first input terminal of the OR gate is connected with the output terminal other than the first output terminal of the first pulse signal strobe 21, a second input terminal of the OR gate is connected with an output terminal of the stage of shift register unit previous to the predetermined shift register unit, and an output terminal of the OR gate is connected with an input terminal of the predetermined shift register unit.

In an example, the second strobe module 30 according to the present embodiment comprises:

a second pulse signal strobe 31, input terminals thereof are connected with the strobe signal and the output terminal of the stage of shift register unit previous to the predetermined shift register unit, respectively, and an output terminal thereof is connected with the input terminal of the predetermined shift register unit respectively.

Figure 4:
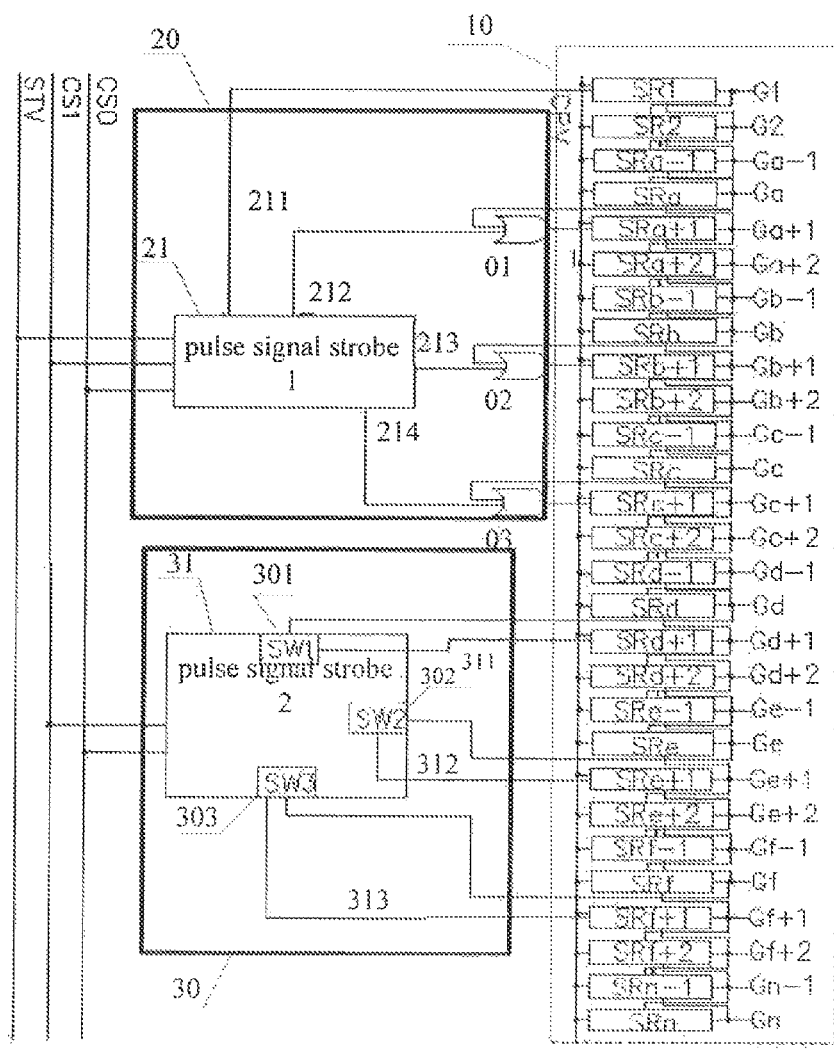
FIG. 4 is a view illustrating a design principle of a gate driving circuit according to an embodiment of the present disclosure.

Based on the above, the present embodiment provides a gate driving circuit, and FIG. 4 illustrates its design principle view, wherein STV denotes the gate scanning trigger signal, CPV is the gate driving clock signal, CS0 and CS1 are the first strobe signal and the second strobe signal respectively, OR Gate1, OR Gate2 and OR Gate3 denote three OR gates respectively and correspond to numbers 01, 02 and 03 respectively. The first strobe module is denoted as 20, the first pulse signal strobe is denoted 21, and the first output terminal, second output terminal, third output terminal and fourth output terminal of the first pulse signal strobe 21 are denoted as 211, 212, 213 and 214 respectively. The second strobe module is denoted as 30, the second pulse signal strobe is denoted as 31, and the first output terminal, second output terminal and third output terminal of the second pulse signal strobe 31 are denoted as 311, 312 and 313 respectively, wherein each output terminal is controlled by a switch, that is, a switch SW1 for the first output terminal is 301, a switch SW2 for the second output terminal is 302 and a switch SW3 for the third output terminal is 303. The shift register is denoted as 10, and the shift register units therein are denoted as SR1, SR2, . . . , SRn respectively.

It should be noted that only one of the output terminals of the first pulse signal strobe 21 is activated at the same moment.

In an example of the embodiment, the number of the strobe signals is N, the number of the output terminals of the first pulse signal strobe is M, the number of the OR gates is at most M−1, and the number of the output terminals of the second pulse signal strobe 31 is L, wherein M≤$2^N$, L≤$2^N$, L, M and N are all natural numbers.

For example, below will describe a scheme according to the present embodiment. There are a first strobe signal CS0 and a second strobe signal CS1, when N=2, M=4, L=3, that is, when the number of the strobe signals is 2. Accordingly, the number of the output terminals of the first pulse signal strobe 21 in the gate driving circuit is 4, namely 211, 212, 213 and 214, and there are included 3 OR gates, namely OR Gate1, OR Gate2 and OR Gate3; the number of the output terminals of the second pulse signal strobe 31 is 3, namely 311, 312 and 313. It should be noted that the "OR gate" can also be an "AND gate" or a "NOT" gate, and the embodiments of the present disclosure take the OR gate as an example for illustration.

In particular, besides the gate driving clock signal CPV, the first stage of shift register unit SR1 is further connected with the first output terminal 211 of the first pulse signal strobe 21. Except for the first output terminal 211, the output terminals of the first pulse signal strobe 21 are connected with the corresponding OR gates (OR Gates) prior to the shift register unit, the input terminals of the OR gate is connected with the output terminal of the first pulse signal strobe 21 and the output terminal of the previous stage of shift register unit respectively, and the output terminal of the OR gate is connected with the present stage of shift register unit in the shift register 10.

It should be noted that not the input terminals of all shift register units in the shift register 10 are connected with the output terminals of the first pulse signal strobe 21 via the OR gates, therefore the number of the OR gates is at most M−1, that is, may be varied between 1~M−1 depending on the requirements, when the number of the output terminals of the first pulse signal strobe 21 is M. The output terminals of the first pulse signal strobe 21 except for the first output terminal 211, that is, the second output terminal 212, the third output terminal 213 and the fourth output terminal 214 are connected with the input terminals of the shift register units via the OR gates respectively. For example, the second output terminal 212 of the first pulse signal strobe 21 is connected with the input terminal of the $(a+1)^{th}$ stage of shift register unit via the first OR gate (OR Gate1), particularly, another input terminal of the first OR gate (OR Gate1) is connected with the output terminal Ga of the $a^{th}$ shift register unit, and the output terminal of the first OR gate (OR Gate1) is connected with the input terminal of the $(a+1)^{th}$ stage of shift register, and so on.

It should be further noted that the number of the output terminals of the first pulse signal strobe 21 and the number of the OR gates are determined based on the number of the strobe signals.

In particular, only one of the output terminals of the first pulse signal strobe 21 can be activated at a same time, and potentials of the remaining output terminals which are not activated are pulled down; at least one of the output terminals of the second pulse signal strobe 31 is activated at the same time, or none of them is activated. In practice, the first pulse signal strobe 21 is a Single-Point Multi-Throw switch, which means only one path can be switched on at the same time; the second pulse signal strobe 31 is a strobe comprising a plurality of Single-Point Single Throw switches, that is, respective paths are switched on or switched off independently, which means any one path is switched on or switched off by controlling a high or low level at the input terminal.

The switch for any one of the output terminals of the second pulse signal strobe 31 is connected with the output terminal of the previous stage of shift register unit and the input terminal of the present stage of shift register unit. For example, the first output terminal 311 of the second pulse signal strobe 31 is controlled by the first switch 301, and the switch SW1 for the first output terminal 311 is connected with the output terminal Gd of the $d^{th}$ stage of shift register unit SRd and the input terminal of the $(d+1)^{th}$ stage of shift register unit SRd+1, wherein the $d^{th}$ stage is the previous stage mentioned herein, and the $(d+1)^{th}$ is the present stage mentioned herein.

Figures 5, 6:
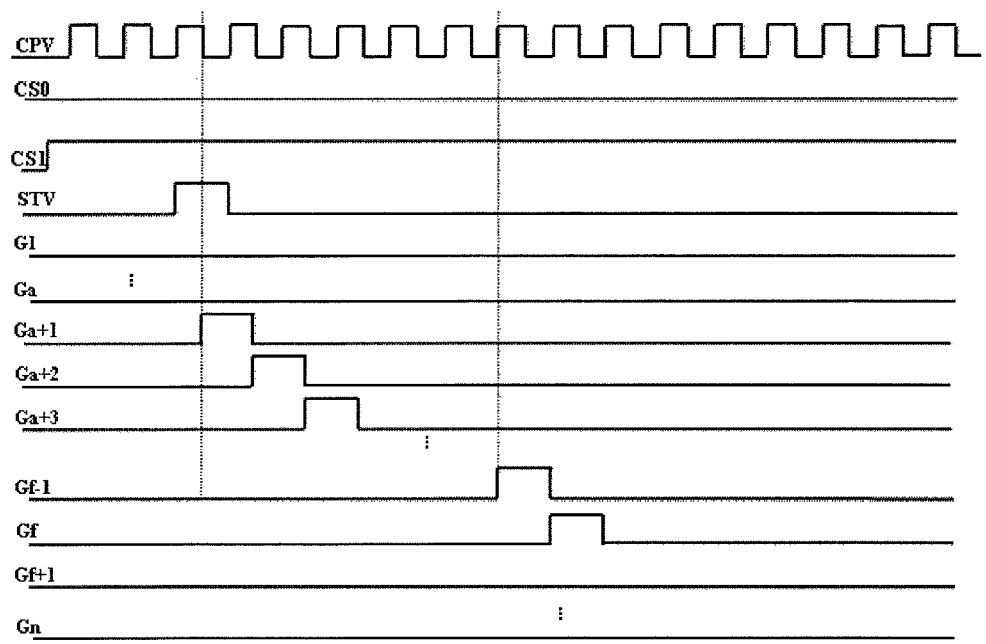
FIG. 5 is a look-up table for a control signal function of strobe signals in the embodiments of the present disclosure.
FIG. 6 is a timing diagram in a partial display mode according to the embodiments of the present disclosure, when CS0=0, CS1=1.

Furthermore, a look-up table for a control signal function of the two strobe signals CS0 and CS1 at the input terminals of the first strobe module 20 and the second strobe module 30 is illustrated in FIG. 5, wherein VGL is a negative voltage input terminal of the TFT liquid crystal display panel, S represents ON, and O represents OFF.

The gate driving clock signal CPV is connected with each stage of shift register units SRs, and except for the first stage of shift register unit SR1, the output signal Gi (wherein 1<i≤n) of each stage of shift register units is connected with a reset signal input terminal of the previous stage of shift register unit SRi−1, and is configured to reset the previous stage of shift register unit.

Furthermore, a timing controller T-CON is required in the present embodiment to control the signals CPV, STV, CS0 and CS1. It should be noted that the number of the strobe signal CS is not limited to two, and can be selected depending on the state of the partial display mode which is compatible. In an example, the gate scanning trigger signal STV is only supplied to the first pulse signal strobe 21, the CS0 and CS1 are supplied to both of the first pulse signal strobe 21 and the second pulse signal strobe 31. The first pulse signal strobe 21 has multi-path outputs, and has 4-path outputs in the present embodiment but the present disclosure is not limited thereto.

The first output terminal 211 of the first pulse signal strobe 21 is connected with the input terminal of the first stage of shift register unit SR1, the second output terminal 212 is connected with one input terminal of the OR gate 1 (OR Gate1, namely 01), the third output terminal 213 is connected with one input terminal of the OR gate 2 (OR Gate2, namely 02), and the fourth output terminal 214 is connected with one input terminal of the OR gate 3 (OR Gate3, namely 03). The output terminal of the $a^{th}$ stage of shift register unit SRa is connected with the other input terminal of the OR gate 1 (OR Gate1), and the output terminal of the OR gate 1 (OR Gate1) is connected with the input terminal of the $(a+1)^{th}$ stage of shift register unit SRa+1. The output terminal of the $b^{th}$ stage of shift register unit SRb is connected with the other input terminal of the OR gate 2 (OR Gate2), and the output terminal of the OR gate 2 (OR Gate2) is connected with the input terminal of the (b+1) stage of shift register unit SRb+1. The output terminal of the $c^{th}$ stage of shift register unit SRc is connected with the other input terminal of the OR gate 3 (OR Gate3), and the output terminal of the OR gate 3 (OR Gate3) is connected with the input terminal of the $(c+1)^{th}$ stage of shift register unit SRc+1. The output terminal Gi of each stage from the first stage of shift register unit SRl to the $(a-1)^{th}$ stage of shift register unit SRa−1 is connected with the input terminal of a next stage of shift register unit SRi+1 thereof, the output terminal Gj of each stage from the $(a+1)^{th}$ stage of shift register unit SRa+1 to the $(b-1)^{th}$ stage of shift register unit SRb−1 is connected with the input terminal of a next stage of shift register unit SRj+1 thereof, and the output terminal Gk of each stage from the $(c+1)^{th}$ stage of shift register unit SRc+1 to the $(d-1)^{th}$ stage of shift register unit SRd−1 is connected with the input terminal of a next stage of shift register unit SRk+1. The three stages described above are taken as an example for illustration, and the selection of values for a/b/c depends on the kind of the partial display supported by the timing controller T-CON. For example, for a timing controller T-CON for a WXGA (Wide Extended Graphics Array) having a resolution of 800*1280, if the timing controller supports the partial display modes of 600*1024/540*960/480*800, etc, the values of a, b, c may be selected as a=128, b=160 and c=240.

Accordingly, the output terminal of the $d^{th}$ stage of shift register unit SRd is connected with the Single-Point Single Throw switch SW1 for the first output terminal 311 of the second pulse signal strobe 31, and the SW1 is further connected with the input terminal of the $(d+1)^{th}$ stage of shift register unit SRd+1. The output terminal of the $e^{th}$ stage of shift register unit SRe is connected with the Single-Point Single Throw switch SW2 for the second output terminal 312 of the second pulse signal strobe 31, and the SW2 is further connected with the input terminal of the $(e+1)^{th}$ stage of shift register unit SRe+1. The output terminal of the $f^{th}$ stage of shift register unit SRf is connected with the Single-Point Single Throw switch SW3 for the third output terminal 313 of the second pulse signal strobe 31, and the SW3 is further connected with the input terminal of the $(f+1)^{th}$ stage of shift register unit SRf+1. The output terminal Gl of each stage from the $(d+1)^{th}$ stage of shift register unit SRd+1 to the $(e-1)^{th}$ stage of shift register unit SRe−1 is connected with the input terminal of a next stage of shift register unit SRl+1, the output terminal Gm of each stage from the $(e+1)^{th}$ stage of shift register unit SRe+1 to the $(f-1)^{th}$ stage of shift register unit SRf−1 is connected with the input terminal of a next stage of shift register unit SRm+1, and the output terminal Gp of each stage from the $(f+1)^{th}$ stage of shift register unit SRf+1 to the $(n-1)^{th}$ stage of shift register unit SRn−1 is connected with the input terminal of a next stage of shift register unit SRp+1. The three stages described above are taken as an example for illustration, and the selection of values for d/e/f depends on the kind of the partial display supported by the timing controller T-CON. For example, for the timing controller T-CON for the WXGA (Wide Extended Graphics Array) having a resolution of 800*1280, if the timing controller supports the partial display modes of 600*1024/540*960/480*800, etc, the values of d, e, f may be selected as d=1040, e=1120 and f=1152.

The first strobe module 20 comprises the Single-Point Multi Throw switch and the second strobe module 30 comprises the plurality of Single-Point Single Throw switches, therefore, when CS0=CS1=0, the first output terminal 211 of the first pulse signal strobe 21 is activated, that is, the first output terminal 211 outputs the signal STV to the input terminal of the first stage of shift register unit SR1, while the second output terminal 212, the third output terminal 213 and the fourth output terminal 214 are pulled down, and the switches SW1, SW2, SW3 at the output terminals in the second pulse signal strobe 31 are all turned on (namely, S in FIG. 5); when CS0=0 and CS1=1, the second output terminal 212 of the first pulse signal strobe 21 is activated, while the first output terminal 211, the third output terminal 213 and fourth output terminal 214 are pulled down, the switches SW1, SW2 at the output terminals in the second pulse signal strobe 31 are turned on (namely, S), and SW3 is turned off (namely, O); when CS0=1 and CS1=0, the third output terminal 213 of the first pulse signal strobe 21 is activated, while the first output terminal 211, the second output terminal 212 and the fourth output terminal 214 are pulled down, the switch SW1 in the second pulse signal strobe 31 is turned on (namely, S), and the switches SW2, SW3 are turned off (namely, O); and when CS0=1 and CS1=1, the fourth output terminal 214 of the first pulse signal strobe 21 is activated, while the first output terminal 211, the second output terminal 212 and the third output terminal 213 are pulled down, and all of the switches SW1, SW2, SW3 in the second pulse signal strobe 31 are turned off (namely, O). Herein, when the timing controller T-CON enters the partial display mode, the timing controller firstly maintains the signals CS0, CS1 at the a level for 2 frames and notifies a source driving chip to perform a black-scan action at the same time, that is to say, the storage capacitors in pixels in the black-scan area are discharged to a black voltage (a low voltage), and then switches the levels of the CS0 and CS1 to the corresponding configuration states for the partial display.

1) When CS0=CS1=0, the first output terminal 211 of the first pulse signal strobe 21 is activated, all of the switches SW1, SW2, SW3 in the second pulse signal strobe 31 are turned on, and then the signal STV is supplied to the first stage of shift register unit SR1. When the output terminal Ga of the $a^{th}$ stage of shift register unit is at a high level, the OR gate OR Gate1 outputs a high level, and the $(a+1)^{th}$ stage of shift register unit SRa+1 operates normally. When the output terminal Gb of the $b^{th}$ stage of shift register unit is at a high level, the OR gate OR Gate2 outputs a high level, and the $(b+1)^{th}$ stage of shift register unit SRb+1 operates normally. When the output terminal Gc of the $c^{th}$ stage of shift register unit is at a high level, the OR gate OR Gate3 outputs a high level, and the $(c+1)^{th}$ stage of shift register unit SRc+1 operates normally. The output terminal Gd of the $d^{th}$ stage of shift register unit SRd is connected with the input terminal of the $(d+1)^{th}$ stage of shift register unit SRd+1, and the $(d+1)^{th}$ stage of shift register unit SRd+1 operates normally. The output terminal Ge of the $e^{th}$ stage of shift register unit SRe is connected with the input terminal of the $(e+1)^{th}$ stage of shift register unit SRe+1, and the $(e+1)^{th}$ stage of shift register unit SRe+1 operates normally. The output terminal Gf of the $f^{th}$ stage of shift register unit SRf is connected with the input terminal of the $(f+1)^{th}$ stage of shift register unit SRf+1, and the $(f+1)^{th}$ stage of shift register unit SRf+1 operates normally. In this manner, the timing controller T-CON and the gate driving circuit operate in a normal display mode.

2) When CS0=0 and CS1=1, the second output terminal 212 of the first pulse signal strobe 21 is activated, the switches SW1, SW2 in the second pulse signal strobe 31 are turned on, the switch SW3 is turned off, therefore the signal STV is supplied to the input terminal of the OR gate (OR Gate1), the OR gate (OR Gate1) outputs a high level, and the $(a+1)^{th}$ stage of shift register unit SRa+1 operates normally. When the output terminal Gb of the $b^{th}$ stage of shift register unit is at a high level, the OR gate (OR Gate2) outputs a high level, and the $(b+1)^{th}$ stage of shift register unit SRb+1 operates normally. When the output terminal Gc of the $c^{th}$ stage of shift register unit is at a high level, the OR gate (OR Gate3) outputs a high level, and the $(c+1)^{th}$ stage of shift register unit SRc+1 operates normally. Since no signal STV is input to the input terminal of the first stage of shift register unit SR1, each stage from the first stage of shift register unit SR1 to the $a^{th}$ stage of shift register unit SRa outputs a low level continuously, such that the source data can not be written thereto, thus the black voltage (a low level) can be maintained. The output terminal Gd of the $d^{th}$ stage of shift register unit SRd is connected with the input terminal of the $(d+1)^{th}$ stage of shift register unit SRd+1, and the $(d+1)^{th}$ stage of shift register unit SRd+1 operates normally. The output terminal Ge of the $e^{th}$ stage of shift register unit SRe is connected with the input terminal of the $(e+1)^{th}$ stage of shift register unit SRe+1, and the $(e+1)^{th}$ stage of shift register unit SRe+1 operates normally. The output terminal Gf of the $f^{th}$ stage of shift register unit SRf is disconnected from the input terminal of the $(f+1)^{th}$ stage of shift register unit SRf+1, so that no signal STV is inputted to each stage from the $(f+1)^{th}$ stage of shift register unit SRf+1 to the $n^{th}$ stage of shift register unit SRn and the corresponding shift register units output a low level continuously, so that the power consumption of the gate driving circuit can be reduced in the case of the partial display, and the timing diagram in this case is illustrated in FIG. 6.

Figure 7:
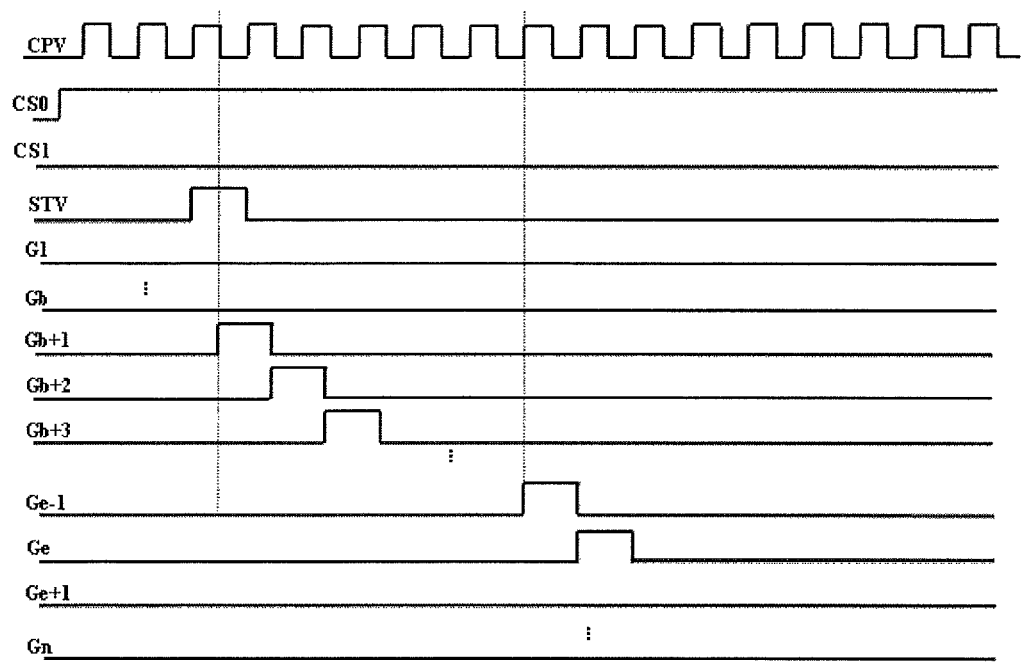
FIG. 7 is a timing diagram in the partial display mode according to the embodiments of the present disclosure, when CS0=1, CS1=0.

3) When CS0=1 and CS1=0, the third output terminal 213 of the first pulse signal strobe 21 is activated, the switch SW1 in the second pulse signal strobe 31 is turned on, the switches SW2 and SW3 are turned off, then the signal STV is supplied to the input terminal of the OR gate (OR Gate2), the OR gate (OR Gate2) outputs a high level, and the $(b+1)^{th}$ stage of shift register unit SRb+1 operates normally. When the output terminal Gc of the $c^{th}$ stage of shift register unit is at a high level, the OR gate (OR Gate3) outputs a high level, and the $(c+1)^{th}$ stage of shift register unit SRc+1 operates normally. Since no signal STV is inputted to the input terminal of the first stage of shift register unit SR1, each stage from the first stage of shift register unit SR1 to the $b^{th}$ stage of shift register unit SRb outputs a low level continuously, such that the source data can not be written thereto, thus the black voltage (the low level) can be maintained. The output terminal Gd of the $d^{th}$ stage of shift register unit SRd is connected with the input terminal of the $(d+1)^{th}$ stage of shift register unit SRd+1, and the $(d+1)^{th}$ stage of shift register unit SRd+1 operates normally. The output terminal Ge of the $e^{th}$ stage of shift register unit SRe is disconnected from the input terminal of the $(e+1)^{th}$ stage of shift register unit SRe+1, so that no signal STV is inputted to each stage from the $(e+1)^{th}$ stage of shift register unit SRe+1 to the $n^{th}$ stage of shift register unit SRn, and the corresponding shift register units output the low level continuously, so that the power consumption of the gate driving circuit can be reduced in the case of the partial display, and the timing diagram in this case is illustrated in FIG. 7.

Figure 8:
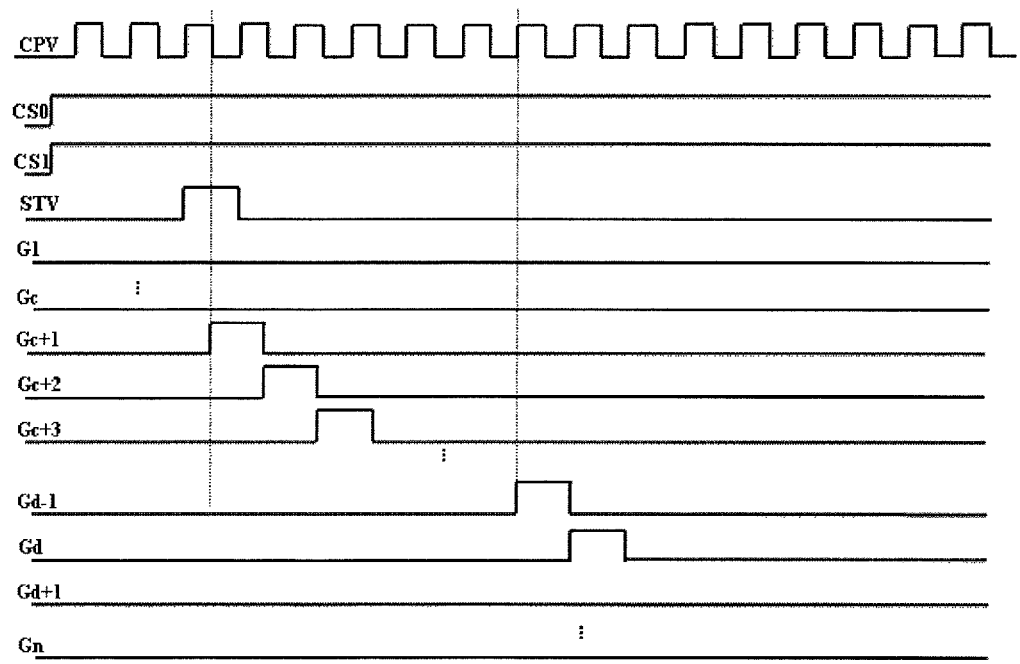
FIG. 8 is a timing diagram in the partial display mode according to the embodiments of the present disclosure, when CS0=1, CS1=1.

4) When CS0=1 and CS1=1, the fourth output terminal 214 of the first pulse signal strobe 21 is activated, all of the switches SW1, SW2, SW3 in the second pulse signal strobe 31 are turned off, then the signal STV is supplied to the input terminal of the OR gate (OR Gate3), the OR gate (OR Gate3) outputs the high level, and the $(c+1)^{th}$ stage of shift register unit SRc+1 operates normally. Since no signal STV is input to the input terminal of the first stage of shift register unit SR1, each stage from the first stage of shift register unit SR1 to the $c^{th}$ stage of shift register unit SRc outputs the low level continuously, such that the source data can not be written thereto, thus the black voltage (the low level) can be maintained. The output terminal Gd of the $d^{th}$ stage of shift register unit SRd is disconnected from the input terminal of the $(d+1)^{th}$ stage of shift register unit SRd+1, so that no signal STV is inputted to each stage from the $(d+1)^{th}$ stage of shift register unit SRd+1 to the $n^{th}$ stage of shift register unit SRn, and the corresponding shift register units output the low level continuously, so that the power consumption of the gate driving circuit can be reduced in the case of the partial display, and the timing diagram in this case is illustrated in FIG. 8.

It should be noted that the above implementations are illustrated by taking a case where the number of the strobe signals is 2 as an example, but the principle of the gate driving circuit according to the embodiments of the present disclosure are also applicable to cases where the number of the strobe signal is one or more than 2, as long as the relevant ports are extended adaptively, and the details are omitted herein.

In the above gate driving circuit, on a basis of the existing shift register, the first strobe module and the second strobe module are added, wherein the first strobe module controls the gate scanning trigger signal to be applied to a shift register unit as required and the second strobe module controls the gate output signals as scanned row by row to be shut off from a shift register unit as required. With the shift register driven by the first strobe module and/or the second strobe module, the gate signal(s) for the black-scan area can be shut off selectively, thus the power consumption of the gate driving circuit is reduced and in turn the power consumption of the whole display panel is reduced.

Based on the gate driving circuit described above, the present disclosure further provides a display apparatus comprising the gate driving circuit described above.

The display apparatus comprising the gate driving circuit described above may be a liquid crystal panel, electrical paper, an OLED panel, a mobile phone, a tablet computer, a TV, a monitor, a notebook computer, a digital photo frame, a navigator and any other products or parts having the display function.

Above implementations are only used for illustrating the present disclosure but not limiting the present invention, and those ordinary skilled in the art can further make various changes and variances to the embodiments of the present disclosure without departing from the spirit and scope of the present invention, therefore all equivalent solutions are also fallen into the scope of the present invention, which would be defined by the claims.

This application claims priority to Chinese Patent Application No. 201310617047.8, filed with the China's State Intellectual Property Office on Nov. 27, 2013, the disclosure of which is incorporated by reference herein as a whole.

What is claimed is:

1. A gate driving circuit comprising a shift register including a plurality of shift register units connected with each other sequentially, the gate driving circuit further comprising:
    a first strobe module, connected to a gate scanning trigger signal line and strobe signal lines, is configured to provide a gate scanning trigger signal on the gate scanning trigger signal line to a first predetermined shift register unit according to strobe signals provided by the strobe signal lines, so that the shift register operates from the first predetermined shift register unit; and
    a second strobe module, connected to the strobe signal lines, is configured to cut off communication between a second predetermined shift register unit other than the first stage of shift register unit and a stage of shift register unit previous to the second predetermined shift register unit according to the strobe signals provided by the strobe signal lines, so that the shift register is turned off from the second predetermined shift register unit;
    wherein the first strobe module comprises a first pulse signal strobe and at least one OR gate,
    input terminals of the first pulse signal strobe are connected with the gate scanning trigger signal and the strobe signals respectively, a first output terminal of the first pulse signal strobe is connected with an input terminal of a first stage of shift register unit in the shift register, and a second output terminal of the first pulse signal strobe is connected with a first input terminal of the OR gate;
    a second input terminal of the OR gate is connected with an output terminal of the stage of shift register unit previous to the first predetermined shift register unit other than the first stage of shift register unit, and an output terminal of the OR gate is connected with an input terminal of the first predetermined shift register unit.

2. The gate driving circuit of claim 1, wherein the second strobe module comprises:
    a second pulse signal strobe, input terminals thereof are connected with the strobe signals and the output terminal of the stage of shift register unit previous to the second predetermined shift register unit, respectively, and an output terminal of the second pulse signal strobe is connected with the input terminal of the second predetermined shift register unit.

3. The gate driving circuit of claim 2, wherein the number of the strobe signals is N, the number of the output terminals of the first pulse signal strobe is M, the number of OR gates is at most M−1, and the number of the output terminals of the second pulse signal strobe is L, wherein $M \leq 2^N$, $L \leq 2^N$, and L, M and N are all natural numbers.

4. The gate driving circuit of claim 3, wherein the strobe signals comprises a first strobe signal and a second strobe signal, when N=2, M=4, L=3.

5. The gate driving circuit of claim 4, wherein, when both of the first strobe signal and the second strobe signal are at a low level, the first output terminal of the first pulse signal strobe is activated, the second output terminal, the third output terminal and the fourth output terminal output a low level, and the first output terminal, the second output terminal and the third output terminal of the second pulse signal strobe are activated.

6. The gate driving circuit of claim 4, wherein, when the first strobe signal is at a low level while the second strobe signal is at a high level, the second output terminal of the first pulse signal strobe is activated, the first output terminal, the third output terminal and the fourth output terminal output a low level, and the first output terminal and the second output terminal of the second pulse signal strobe are both activated but the third output terminal thereof is not activated.

7. The gate driving circuit of claim 4, wherein, when the first strobe signal is at a high level and the second strobe signal is at a low level, the third output terminal of the first pulse signal strobe is activated, the first output terminal, the second output terminal and the fourth output terminal output a low level; the first output terminal of the second pulse signal strobe is activated, and neither of the second output terminal and the third output terminal is activated.

8. The gate driving circuit of claim 4, wherein, when both of the first strobe signal and the second strobe signal are at a high level, the fourth output terminal of the first pulse signal strobe is activated, the first output terminal, the second output terminal and the third output terminal output a low level, and none of the first output terminal, the second output terminal and the third output terminal of the second pulse signal strobe is activated.

9. The gate driving circuit of claim 1, wherein only one of the output terminals of the first pulse signal strobe is activated at a same moment.

10. The gate driving circuit of claim 1, wherein except for the first stage of shift register unit, an output terminal of each stage of shift register unit in the shift register is connected with a corresponding reset signal input terminal of a previous stage of shift register unit, and is configured to reset the previous stage of shift register unit; and an input terminal of each stage of shift register unit in the shift register is connected with a gate driving clock signal.

11. A display apparatus comprising a plurality of gate lines and the gate driving circuit of claim 1, and the output terminals of the respective shift register units are connected with respective gate lines one-to-one.

12. The display apparatus of claim 11, wherein the second strobe module comprises:

a second pulse signal strobe, input terminals thereof are connected with the strobe signals and the output terminal of the stage of shift register unit previous to the second predetermined shift register unit, respectively, and an output terminal of the second pulse signal strobe is connected with the input terminal of the second predetermined shift register unit.

13. The display apparatus of claim 12, wherein the number of the strobe signals is N, the number of the output terminals of the first pulse signal strobe is M, the number of OR gates is at most M−1, and the number of the output terminals of the second pulse signal strobe is L, wherein $M \leq 2^N$, $L \leq 2^N$, and L, M and N are all natural numbers.

14. The display apparatus of claim 13, wherein the strobe signals comprises a first strobe signal and a second strobe signal, when N=2, M=4, L=3.

15. The display apparatus of claim 11, wherein only one of the output terminals of the first pulse signal strobe is activated at a same moment.

16. The display apparatus of claim 11, wherein except for the first stage of shift register unit, an output terminal of each stage of shift register unit in the shift register is connected with a corresponding reset signal input terminal of a previous stage of shift register unit, and is configured to reset the previous stage of shift register unit; and an input terminal of each stage of shift register unit in the shift register is connected with a gate driving clock signal.

\* \* \* \* \*